United States Patent
So et al.

(10) Patent No.: US 9,418,755 B2
(45) Date of Patent: Aug. 16, 2016

(54) SHIFT REGISTER AND FLAT PANEL DISPLAY DEVICE INCLUDING THE SAME

(71) Applicant: LG DISPLAY CO., LTD, Seoul (KR)

(72) Inventors: Byeong-Seong So, Paju-si (KR); Seung-Ho Heo, Paju-si (KR); JoungMi Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 360 days.

(21) Appl. No.: 14/082,682

(22) Filed: Nov. 18, 2013

(65) Prior Publication Data

US 2014/0152629 A1   Jun. 5, 2014

(30) Foreign Application Priority Data

Dec. 5, 2012   (KR) .................. 10-2012-0140430

(51) Int. Cl.
*G11C 19/28* (2006.01)
*G09G 3/32* (2016.01)
*G09G 3/36* (2006.01)

(52) U.S. Cl.
CPC .............. *G11C 19/28* (2013.01); *G09G 3/3266* (2013.01); *G09G 3/3677* (2013.01)

(58) Field of Classification Search
None
See application file for complete search history.

(56) References Cited

U.S. PATENT DOCUMENTS

| 7,106,292 B2 * | 9/2006 | Moon .................. G09G 3/3677 345/100 |
| 8,866,724 B2 * | 10/2014 | Moon .................. G09G 3/3677 377/64 |
| 2010/0158187 A1 | 6/2010 | Moon et al. |
| 2011/0002438 A1 | 1/2011 | Kim |
| 2011/0317803 A1 * | 12/2011 | Chiu ...................... G11C 19/28 377/67 |

FOREIGN PATENT DOCUMENTS

| CN | 101752004 A | 6/2010 |
| CN | 102290040 A | 12/2011 |
| KR | 2007-0117979 A | 12/2007 |
| KR | 1020080003065 A | 7/2008 |
| WO | 2013/037156 A1 | 3/2013 |

* cited by examiner

*Primary Examiner* — Long Nguyen
(74) *Attorney, Agent, or Firm* — Dentons US LLP (57) ABSTRACT

Disclosed are a shift register and a flat panel display device. The shift register includes a plurality of stages that supply a gate-on voltage pulse to a plurality of gate lines formed in a display panel. Each of the stages includes a pull-up transistor configured to supply one of a plurality of clock signals to an output node according to a voltage of a first node, a pull-down transistor configured to supply a gate-off voltage to the output node according to a voltage of a second node, a node controller configured to control the voltages of the first and second nodes on the basis of a gate start signal, and a switching unit connected to at least two gate lines adjacent to the output node, and configured to sequentially supply gate-on voltage pulses having different pulse widths to the at least two adjacent gate lines using the clock signal.

18 Claims, 10 Drawing Sheets

SHIFT REGISTER AND FLAT PANEL DISPLAY DEVICE INCLUDING THE SAME

CROSS-REFERENCE TO RELATED APPLICATIONS

This application claims the benefit of the Korean Patent Application No. 10-2012-0140430 filed on Dec. 5, 2012, which is hereby incorporated by reference for all purposes as if fully set forth herein.

BACKGROUND OF THE INVENTION

1. Field of the Invention

The present invention relates to a shift register and a flat panel display device including the same.

2. Discussion of the Related Art

With the advance of multimedia, display devices are increasing in importance. Therefore, flat panel display (FPD) devices, such as liquid crystal display (LCD) devices, plasma display panels (PDPs), organic light emitting display devices, etc., are being commercialized. Among such FPD devices, LCD devices and organic light emitting display devices have excellent characteristics such as thinness, light weight, and low power consumption. Thus, they are widely used as display devices for notebook computers, televisions, tablet computers, monitors, smart phones, portable display devices, portable information devices, etc.

The LCD devices and the organic light emitting display devices include a display panel that includes a plurality of pixels including a thin film transistor (TFT) connected to a data line and a gate line, a data driver that supplies respective data voltages to a plurality of the data lines, and a gate driver that is configured with a shift register for sequentially supplying a gate signal to a plurality of the gate lines.

Generally, each of the data driver and the gate driver is implemented as an integrated circuit (IC). Such a data driving IC and gate driving IC are mounted on a flexible circuit film such as a tape carrier package (TCP) or a chip-on film (COF), and adhered to a display panel.

Display devices, having a gate-in panel (GIP) structure in which the shift register configuring the gate driver is built into the display panel when a process of manufacturing the TFTs of the respective pixels is being performed, are being developed to reduce the number of circuit elements, the manufacturing cost, and a bezel width.

Figure 1:
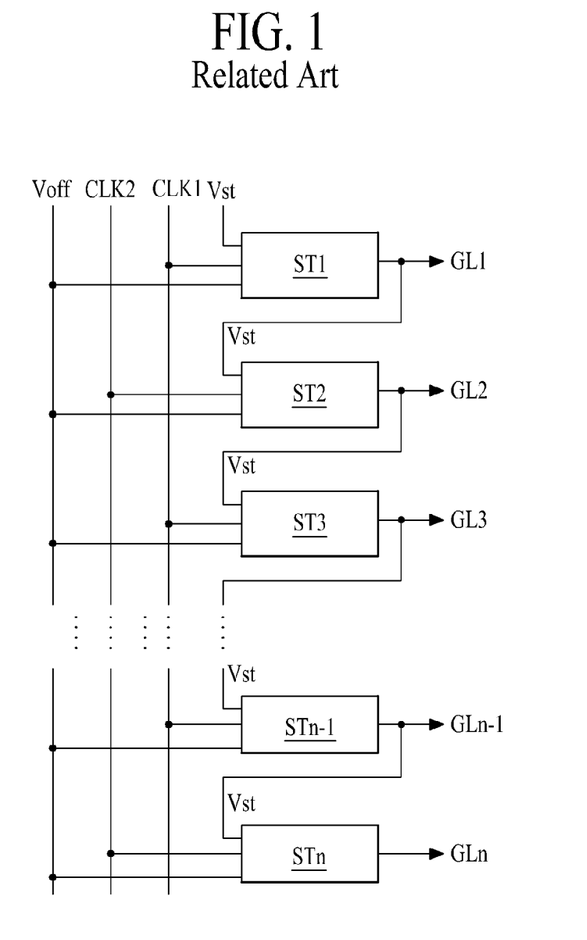
FIG. 1 is a diagram describing a related art shift register built in a display panel of a display device having a GIP structure.

FIG. 1 is a diagram describing a related art shift register built in a display panel of a display device having the GIP structure.

Referring to FIG. 1, the related art shift register includes n number of stages ST1 to STn which are selectively connected to first and second clock signal supply lines through first and second clock signals CLK1 and CLK2 respectively supplied, and are driven in cascade according to a gate start signal Vst.

The gate start signal Vst is supplied to the first stage ST1. Also, each of the second to nth stages ST2 to STn receives an output signal of a stage (for example, one of the stages ST1 to STn-1) previous thereto as the gate start signal Vst.

Each of the n stages ST1 to STn includes: a pull-up transistor that is turned on according to a voltage of a first node, and receives only one of the first and second clock signals CLK1 and CLK2 to supply the received clock signal to a corresponding gate line GL as a gate-on voltage pulse; a pull-down transistor that is turned on according to a voltage of a second node, and supplies a gate-off voltage Voff to the gate line GL; and a node controller that is configured with a plurality of node control transistors, and controls the voltage of each of the first and second nodes. Each of the n stages ST1 to STn supplies a gate-on voltage pulse of a gate-on voltage corresponding to the first or second clock signal CLK1 or CLK2 to a corresponding gate line GL through the pull-up transistor which is turned on with the voltage of the first node controlled by the node controller according to the gate start signal Vst, and then supplies the gate-off voltage Voff to the corresponding gate line GL through the pull-down transistor which is turned on with the voltage of the second node controlled by the node controller.

In the above-described shift register, the pull-up transistor is formed to have an area relatively greater than other transistors, for stably supplying the gate-on voltage pulse to the gate line corresponding thereto. For this reason, an area of each stage is enlarged.

In addition, in the display device including the built-in gate driver configured with the shift register, since one stage is needed for driving one gate line, an area occupied by the gate driver is enlarged, causing an increase in bezel width.

SUMMARY OF THE INVENTION

Accordingly, the present invention is directed to a shift register and a flat panel display device including the same that substantially obviate one or more problems due to limitations and disadvantages of the related art.

An advantage of the present invention is to provide a shift register with a reduced area and a flat panel display device including the same.

Another advantage of the present invention is to provide a flat panel display device that has a reduced bezel width by using a shift register with a reduced area.

Additional advantages and features of the invention will be set forth in part in the description which follows and in part will become apparent to those having ordinary skill in the art upon examination of the following or may be learned from practice of the invention. These objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a shift register including a plurality of stages configured to supply a gate-on voltage pulse to a plurality of gate lines which are formed in a display panel, each of the plurality of stages including: a pull-up transistor configured to supply one of a plurality of clock signals to an output node according to a voltage of a first node; a pull-down transistor configured to supply a gate-off voltage to the output node according to a voltage of a second node; a node controller configured to control the voltages of the first and second nodes on the basis of a gate start signal; and a switching unit connected to at least two gate lines adjacent to the output node, and configured to sequentially supply gate-on voltage pulses having different pulse widths to the at least two adjacent gate lines by using the clock signal supplied to the output node, respectively.

In another aspect of the present invention, there is provided a flat panel display device including: a display panel configured to include an active area, including a plurality of pixels that are respectively formed in a plurality of pixel areas defined by intersections between a plurality of gate lines and a plurality of data lines, and an inactive area defined near the active area; a plurality of data drivers configured to convert input pixel data into data signals, and respectively supply the data signals to the plurality of data lines; a gate driver provided in the inactive area of the display panel in connection with the plurality of gate lines, and configured to generate a gate-on voltage pulse on the basis of a gate start signal and a plurality of clock signals to supply the gate-on voltage pulse to the plurality of gate lines; and a timing controller configured to convert input video data into the pixel data, supply the pixel data to the plurality of data drivers, and supply a gate control signal, including the gate start signal and the plurality of clock signals, to the gate driver, wherein the gate driver includes the shift register.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, embodiments of a shift register and a display device including the same according to the present invention will be described in detail with reference to the accompanying drawings.

Figure 2:
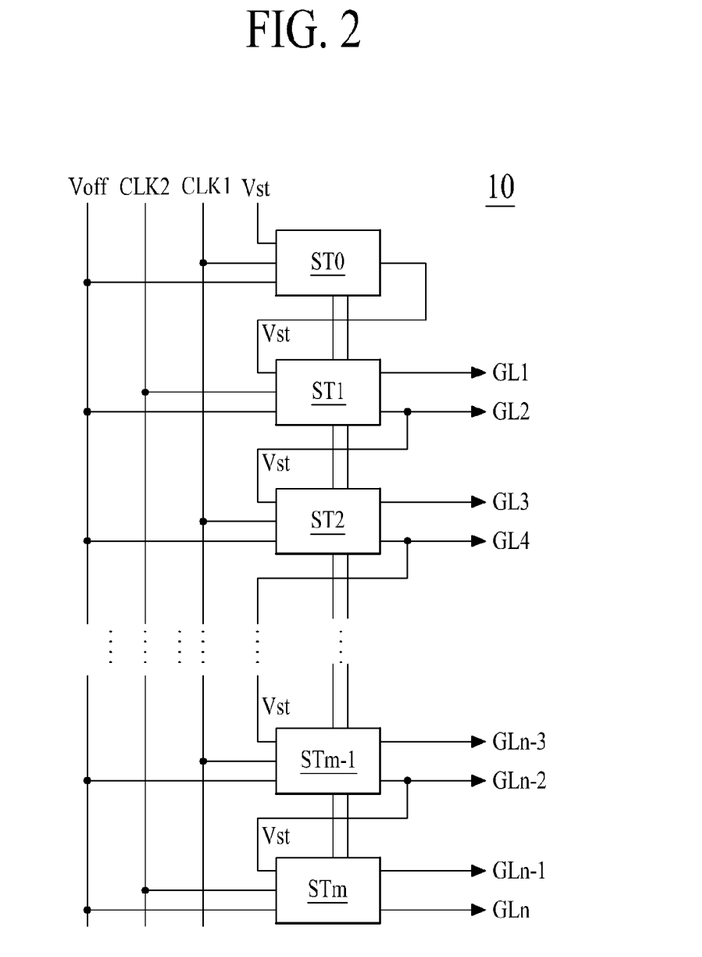
FIG. 2 is a diagram describing a shift register according to an embodiment of the present invention.

FIG. 2 is a diagram for describing a shift register according to an embodiment of the present invention.

Referring to FIG. 2, a shift register 10 according to an embodiment of the present invention includes a dummy stage ST0 and first to mth stages ST1 to STm which are selectively connected to first and second clock signal supply lines through first and second clock signals CLK1 and CLK2 are respectively supplied, and are driven in cascade according to a gate start signal Vst. The shift register 10 having such a configuration is built into a display panel (not shown) of a display device, and supplies a gate-on voltage pulse to n (where n is 2m) number of gate lines which are formed in the display panel.

The gate start signal Vst is a signal which indicates a start of one frame in driving the display panel, and has a gate-on voltage level and a gate-off voltage level. Here, the gate start signal Vst having the gate-on voltage level has a pulse width corresponding to two horizontal periods of the display panel.

The gate start signal Vst is supplied to the dummy stage ST0, and an output signal of the dummy stage ST0 is supplied to the gate start signal Vst of a first stage ST1. Each of second to mth stages ST2 to STm receives an output signal of a stage (for example, one of the stages ST1 to STm−1) previous thereto as the gate start signal Vst.

The first clock signal CLK1, in which a gate-on voltage Von level and a gate-off voltage Voff level having a pulse width corresponding to two horizontal periods of the display panel are alternated, is supplied to a first clock signal CLK1 line. The second clock signal CLK2, having a phase into which a phase of the first clock signal CLK1 is inverted, is supplied to a second clock signal CLK2 line.

The dummy stage ST0 includes: a pull-up transistor (not shown) that is turned on according to a voltage of a first node based on the gate start signal Vst, and supplies the first clock signal CLK1 to an output node; a pull-down transistor (not shown) that is turned on according to a voltage of a second node based on the gate start signal Vst, and supplies the gate-off voltage Voff to the output node; and a node controller (not shown) that is configured with a plurality of node control transistors, and controls the voltage of each of the first and second nodes. The first clock signal CLK1 supplied to the output node of the dummy stage ST0 is supplied as the gate start signal Vst to the first stage ST1.

Each of the first to mth stages ST1 to STm sequentially supplies the gate-on voltage pulses having different pulse widths to two adjacent gate lines by using one of the first and second clock signals CLK1 and CLK2 according to the gate start signal Vst that is an output signal of a stage (for example, one of the stages ST1 to STm−1) previous thereto and the voltage of each of the first and second node. At this time, the gate-on voltage pulse having a pulse width narrower than that of a clock signal is supplied to an odd-numbered gate line of two gate lines connected to each of the first to mth stages ST1 to STm, and the gate-on voltage pulse having the same pulse width as that of the clock signal is supplied to an even-numbered gate line of the two gate lines.

Figure 3:
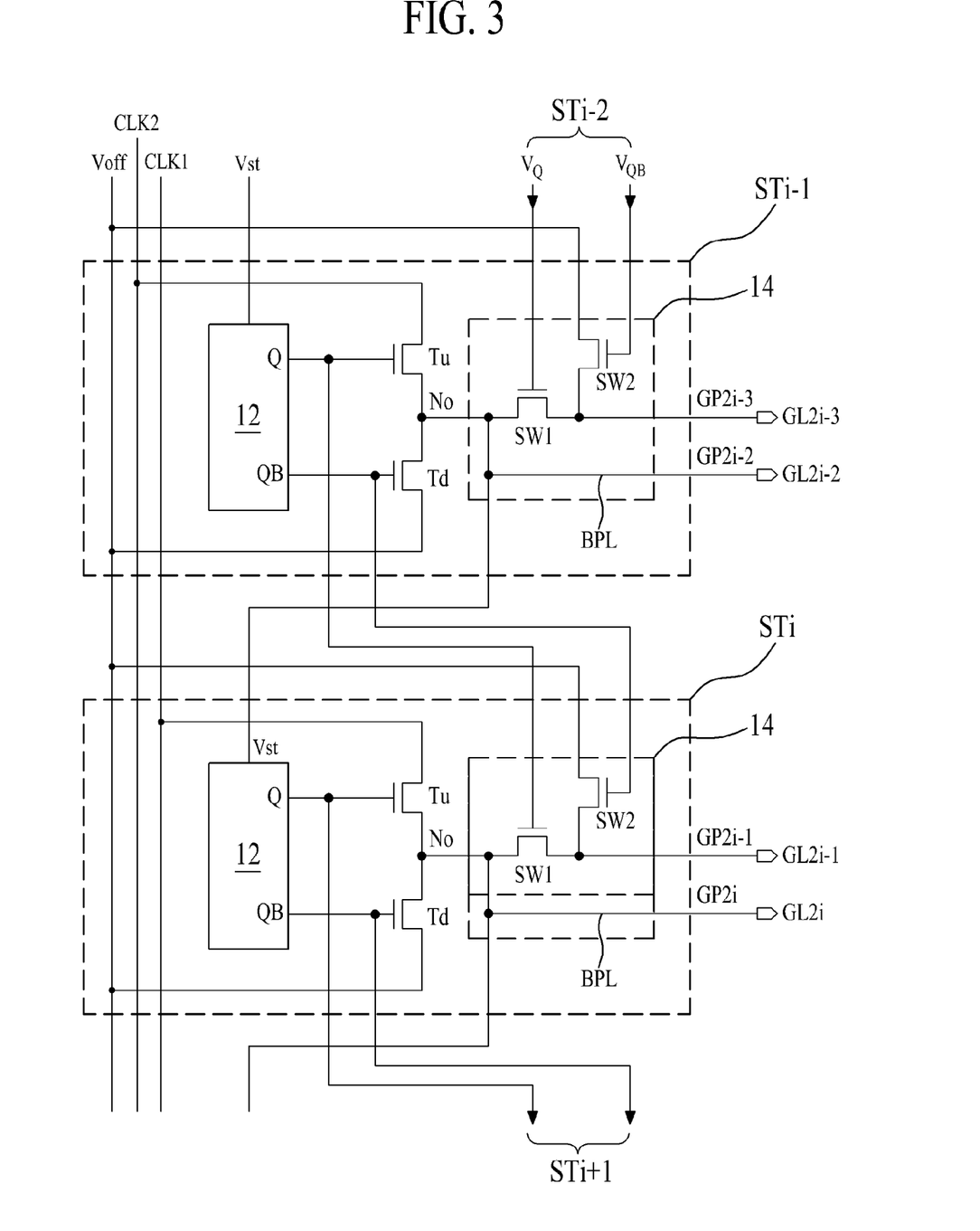
FIG. 3 is a circuit diagram illustrating a configuration of each of vertically adjacent i−1st and ith stages of FIG. 2.

FIG. 3 is a circuit diagram illustrating a configuration of each of vertically adjacent i–1st and ith stages of FIG. 2.

The configuration of each of the first to mth stages ST1 to STm will be described with the ith stage STi of FIG. 3 as an example.

The ith stage STi sequentially supplies different gate-on voltage pulses to 2i–1st and 2ith gate lines GL2i–1 and GL2i by using the first clock signal CLK1, respectively. Hereinafter, the gate-on voltage pulse supplied to the 2i–1st gate line GL2i–1 is referred to as a 2i–1st gate-on voltage pulse, and the gate-on voltage pulse supplied to the 2ith gate line GL2i is referred to as a 2i gate-on voltage pulse.

The ith stage STi includes a pull-up transistor Tu, a pull-down transistor Td, a node controller 12, and a switching unit 14.

The pull-up transistor Tu includes a gate connected to a first node Q, a first terminal connected to the first clock signal CLK1 line, and a second terminal connected to an output node No. The pull-up transistor Tu is turned on according to a voltage of the first node Q connected to the gate, and supplies the first clock signal CLK1, supplied through the first clock signal CLK1 line, to the output node No.

The pull-down transistor Td includes a gate connected to a second node QB, a first terminal connected to the output node No, and a second terminal connected to a gate-off voltage Voff line. The pull-down transistor Td is turned on according to a voltage of the second node QB connected to the gate, and supplies the gate-off voltage Voff, supplied through the gate-off voltage Voff line, to the output node No.

The node controller 12 includes a plurality of node control transistors for controlling a voltage of each of the first and second nodes Q and QB based on the gate start signal Vst that is an output signal of an i–1st stage STi–1.

When the gate start signal Vst having the gate-on voltage level is supplied from the i–1st stage STi–1, the node controller 12 charges the first node Q with the gate-on voltage of the gate start signal Vst according to a turn-on of each of the plurality of node control transistors to turn on the pull-up transistor Tu, and simultaneously discharges the voltage of the second node QB to the gate-off voltage Voff line to turn off the pull-down transistor Td.

In addition, the first clock signal CLK1 having the gate-on voltage level is supplied to the output node No through the turned-on pull-up transistor Tu, and then when an output signal of a next stage STi+1 is received, the node controller 12 discharges the voltage of the first node Q to the gate-off voltage Voff line to turn off the pull-up transistor Tu, and simultaneously supplies a driving voltage to the second node QB to turn on the pull-down transistor Td, thereby allowing the gate-off voltage Voff to be supplied to the output node No through the turned-on pull-down transistor Td.

The node controller 12 of the ith stage STi controls the voltage of the first node Q according to an output signal of a previous stage STi–1 and an output signal of a next stage STi+1, and performs control such that the voltages of the first nodes Q of two adjacent stages STi–1 and STi overlap each other during one horizontal period.

The switching unit 14 is connected to the 2i–1st and 2ith gate lines GL2i–1 and GL2i adjacent to the output node No, and is turned on according to voltages of first and second nodes Q and QB of the i–1st stage STi–1 to respectively supply 2i–1st and 2ith gate-on voltage pulses GP2i–1 and GP2i having different pulse widths to the 2i–1st and 2ith gate lines GL2i–1 and GL2i by using the first clock signal CLK1 supplied to the output node No. That is, the switching unit 14 is turned on according to the voltages of the first and second nodes Q and QB of the i–1st stage STi–1, and adjusts a falling time of the first clock signal CLK1 to supply the 2i–1st gate-on voltage pulse GP2i–1 to the 2i–1st gate line GL2i–1 and to simultaneously bypass the first clock signal CLK1 as the 2ith gate-on voltage pulse GP2i to the 2ith gate line GL2i. To this end, the switching unit 14 includes a switching circuit that is configured with a bypass line BPL and first and second switching transistors SW1 and SW2.

The bypass line BPL is connected to the output node No, and connected to the 2ith gate line GL2i. The bypass line BPL bypasses the first clock signal CLK1 having the gate-on voltage level, supplied through the turned-on pull-up transistor Tu and the output node No, to the 2ith gate line GL2i as the 2ith gate-on voltage pulse GP2i. Therefore, the 2ith gate-on voltage pulse GP2i has the same first pulse width as that of the first clock signal CLK1. For example, the 2ith gate-on voltage pulse GP2i may have the first pulse width corresponding to two horizontal periods of the display panel.

Moreover, the bypass line BPL bypasses the gate-off voltage Voff, supplied through the turned-on pull-down transistor Td and the output node No, to the 2ith gate line GL2i, and thus, after the 2ith gate-on voltage pulse GP2i is supplied, the 2ith gate line GL2i is maintained at the gate-off voltage Voff level.

The first switching transistor SW1 includes a gate connected to the first node Q of the i–1st stage STi–1, a first terminal connected to the output node No, and a second terminal connected to the 2i–1st gate line GP2i–1. The first switching transistor SW1 is turned on during a section in which a gate-on voltage or more is charged into the first node Q of the i–1st stage STi–1, and supplies the first clock signal CLK1 having the gate-on voltage level, supplied through the turned-on pull-up transistor Tu and the output node No, to the 2i–1st gate line GP2i–1 as the 2i–1st gate-on voltage pulse GP2i–1. On the other hand, the first switching transistor SW1 is turned off during a section in which the voltage of the first node Q of the i–1st stage STi–1 is maintained at the gate-off voltage Voff level, and prevents the 2i–1st gate-on voltage pulse GP2i–1 from being supplied from the output node No to the 2i–1st gate line GP2i–1. Thus, the 2i–1st gate-on voltage pulse GP2i–1 has a second pulse width narrower than that of the first clock signal CLK1. For example, the 2i–1st gate-on voltage pulse GP2i–1 may have the second pulse width corresponding to half (1H/2) of one horizontal period of the display panel.

The second switching transistor SW2 includes a gate connected to the second node QB of the i–1st stage STi–1, a first terminal connected to the gate-off voltage Voff line, and a second terminal connected to the second terminal of the first switching transistor SW1 and the 2i–1st gate line GP2i–1 in common. The second switching transistor SW2 and the first switching transistor SW1 are simultaneously turned on during a section in which the driving voltage is charged into the second node QB of the i–1st stage STi–1, and supplies the gate-off voltage Voff, supplied through the gate-off voltage Voff line, to the 2i–1st gate line GP2i–1. On the other hand, the second switching transistor SW2 is turned off simultaneously with the first switching transistor SW1 being turned on during a section in which the voltage of the second node QB of the i–1st stage STi–1 is maintained at the gate-off voltage Voff level, and prevents the gate-off voltage Voff from being supplied from the gate-off voltage Voff line to the 2i–1st gate line GP2i–1.

The switching unit 14 bypasses the first clock signal CLK1, supplied through the turned-on pull-up transistor Tu and the output node No, as the 2ith gate-on voltage pulse GP2i to supply the first clock signal CLK1 to the 2ith gate line GL2i, and simultaneously supplies a portion of the first clock signal CLK1 as the 2i–1st gate-on voltage pulse GP2i–1 to the 2i–1st gate line GL2i–1 on the basis of the voltages of the first and second nodes Q and QB of the i–1st stage STi–1. Thus, the 2i–1st gate-on voltage pulse GP2i–1 having the second pulse width is supplied to the 2i–1st gate line GL2i–1 among the 2i–1st and 2ith gate lines GL2i–1 and GL2i connected to the ith stage STi, and simultaneously the 2ith gate-on voltage pulse GP2i, which has the first pulse width and overlaps the 2i–1st gate-on voltage pulse GP2i–1, is supplied to the 2ith gate lines GL2i.

Each of the pull-up transistor Tu, the pull-down transistor Td, the node control transistor of the node controller 12, and the first and second switching transistors SW1 and SW2 of the switching unit 14 may be an a-Si TFT, a poly-Si TFT, an oxide TFT, or an organic TFT which is formed when a process of manufacturing the TFTs of the display panel is being performed.

In the switching unit 14 of each of the first to mth stages ST1 STm, the gate of the second switching transistor SW2 has been described above as being connected to the second node QB of a previous stage (for example, one of the stages ST0 to STm–1), but may be connected to the second node QB of the present stage without being limited thereto. That is, the first switching transistor SW1 of the switching unit 14 is turned on according to the voltage of the first node Q of a previous stage (one of the stages ST0 to STm–1), but the second switching transistor SW2 may be turned on according to the voltage of the second node QB of a corresponding stage (one of the stages ST1 to STm). In this case, the switching unit 14 operates identically to the above description.

Figure 4:
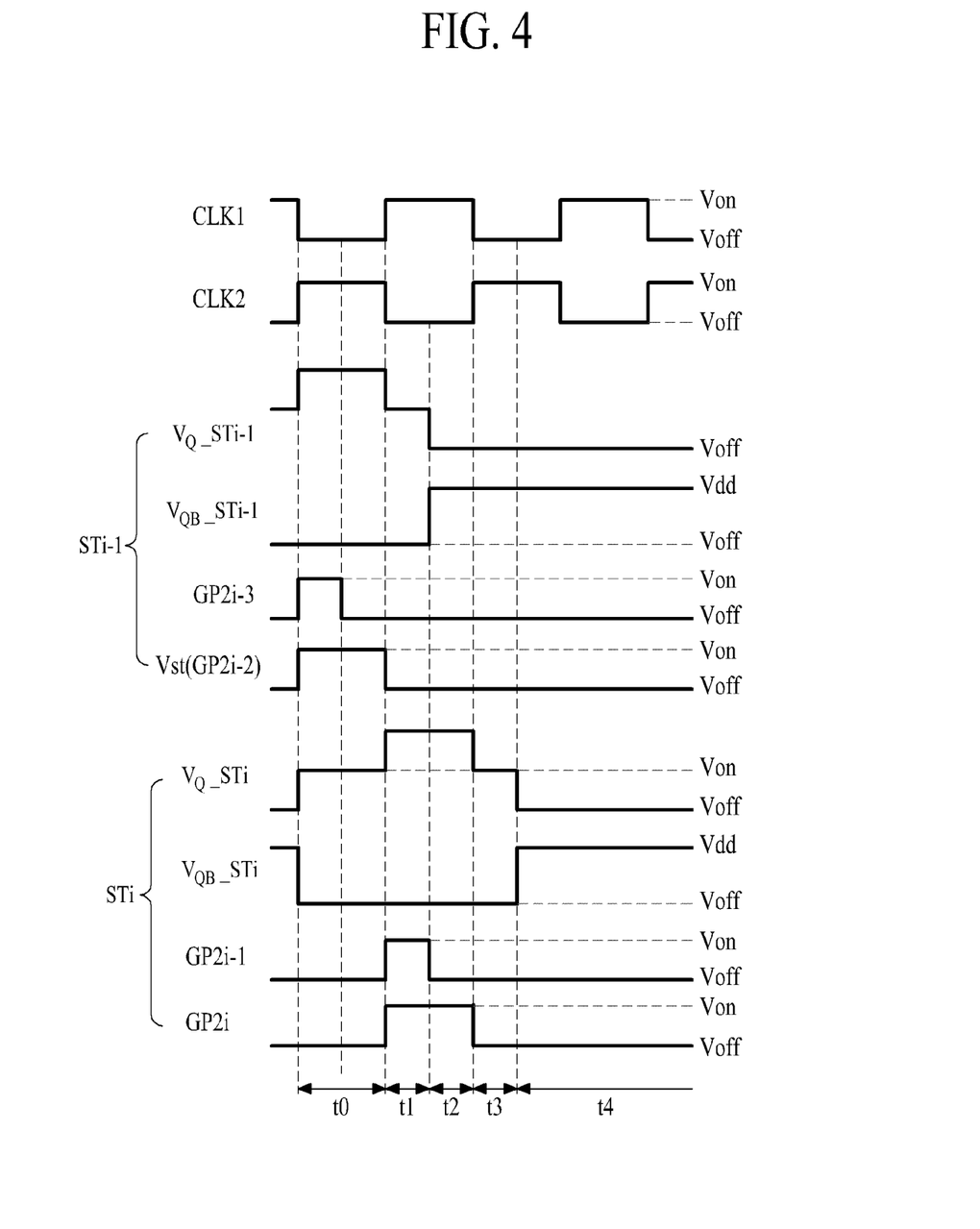
FIG. 4 is a waveform diagram showing driving waveforms of the ith stage of FIG. 3.

FIG. 4 is a waveform diagram showing driving waveforms of the ith stage of FIG. 3. An operation of the ith stage STi will be described with reference to FIGS. 3 and 4.

First, during a t0 period, the i–1st stage STi–1 sequentially supplies 2i–3rd and 2i–2nd gate-on voltage pulses GP2i–3 and GP2i–2 to 2i–3rd and 2i–2nd gate lines GL2i–3 and GL2i–2 with the voltages of the first and second nodes Q and QB and a voltage of first and second nodes Q and QB of the i–2nd stage STi–2 according to control by the node controller 12 based on the gate start signal Vst that is an output signal of the i–2nd stage STi–2 and the second clock signal CLK2 having the gate-on voltage level. At this time, in the i–1st stage STi–1, a voltage $V_Q\_STi$ of the first node Q is changed to the gate-on voltage level Von, and a voltage $V_{QB}\_STi$ of the second node QB is changed to the gate-off voltage level Voff, according to control by the node controller 12 based on the gate start signal Vst that is a 2i–2nd gate-on voltage pulse GP2i–2 supplied from the i–1st stage STi–1 to the 2i–2nd gate line GL2i–2.

Next, during a t1 period, the first clock signal CLK1 having the gate-on voltage level is supplied to the pull-up transistor Tu of the ith stage STi. Thus, the voltage $V_Q\_STi$ of the first node Q of the ith stage STi which is charged with an output signal of the i–1st stage STi–1 during the t0 period increases to a far higher voltage level by bootstrapping based on the first clock signal CLK1 having the gate-on voltage level and a parasitic capacitor of the pull-up transistor Tu, and thus, the pull-up transistor Tu is fully turned on, whereby the first clock signal CLK1 having the gate-on voltage level is quickly supplied to the output node No without being lost. Simultaneously, the switching unit 14 of the ith stage STi bypasses the first clock signal CLK1 having the gate-on voltage level, supplied from the output node No through the bypass line BPL, as the 2ith gate-on voltage pulse GP2i to the 2ith gate line GL2i, and simultaneously turns on the first switching transistor SW1 according to a first node voltage $V_Q\_STi-1$ supplied from the first node Q of the i–1st stage STi–1 to supply the first clock signal CLK1 having the gate-on voltage level, supplied from the output node No, to the 2i–1st gate line GL2i–1 as the 2i–1st gate-on voltage pulse GP2i–1.

During the t1 period, the node controller 12 of the i–1st stage STi–1 receives the 2i–1st gate-on voltage pulse GP2i–1 of the ith stage STi to change the first node voltage $V_Q\_STi-1$ to the gate-on voltage Von level and change a second node voltage $V_{QB}\_STi-1$ to a driving voltage Vdd.

Therefore, during the t1 period, the 2i–1st and 2ith gate-on voltage pulses GP2i–1 and GP2i having the gate-on voltage level which overlap each other are simultaneously supplied to the 2i–1st and 2ith gate lines GL2i–1 and GL2i.

Next, during a t2 period, in the i–1st stage STi–1, the voltage $V_Q\_STi-1$ charged into the first node Q is maintained at the gate-off voltage Voff level, and simultaneously the voltage of the second node QB is maintained at a driving voltage Vdd level. Simultaneously, the first clock signal CLK1 supplied to the ith stage STi is maintained at the gate-on voltage level. Therefore, similarly to the t1 period, the first clock signal CLK1 having the gate-on voltage level is continuously supplied to the output node No of the ith stage STi through the turned-on pull-up transistor Tu. Thus, the switching unit 14 of the ith stage STi continuously bypasses the second clock signal CLK2 having the gate-on voltage level, supplied from the output node No through the bypass line BPL, to the 2ith gate line GL2i. Simultaneously, the switching unit 14 of the ith stage STi turns off the first switching transistor SW1 according to the first node voltage $V_Q\_STi-1$ supplied from the first node Q of the i–1st stage STi–1 to prevent the second clock signal CLK2 having the gate-on voltage level from being supplied from the output node No to the 2i–1st gate line GL2i–1, and simultaneously turns on the second switching transistor SW2 according to the second node voltage $V_{QB}\_STi-1$ supplied from the second node QB of the i–1st stage STi–1 to supply the gate-off voltage Voff, supplied through the gate-off voltage Voff line to the 2i–1st gate line GL2i–1. Thus, during the t2 period, the gate-off voltage Voff is supplied to the 2i–1st gate line GL2i–1, and the 2ith gate-on voltage pulse GP2i having the gate-on voltage level is continuously supplied to the 2ith gate line GL2i.

Next, during a t3 period, the first node Q voltage $V_Q\_STi$ of the ith stage STi is changed to the gate-on voltage Von level, the second node QB of the ith stage STi is maintained at the gate-off voltage Voff level, and the first clock signal CLK1 supplied to the pull-up transistor Tu of the ith stage STI is changed to the gate-off voltage Voff level. Therefore, the first clock signal CLK1 having the gate-off voltage level is newly supplied to the output node No of the ith stage STi through the turned-on pull-up transistor Tu, and thus, the first clock signal CLK1 having the gate-off voltage level is supplied to the 2ith gate line GL2i through the bypass line BPL of the switching unit 14.

Next, during a t4 period after the t3 period, in the ith stage STi, the voltage $V_Q\_STi$ charged into the first node Q is discharged to the gate-off voltage Voff line, and simultaneously the driving voltage Vdd is supplied to the second node QB. Therefore, in the ith stage STi, the pull-up transistor Tu is turned off by discharging of the first node Q, and simultaneously the pull-down transistor Td is turned on with the driving voltage Vdd supplied to the second node QB, whereby the gate-off voltage Voff is supplied from the gate-off voltage Voff line to the output node No, and the gate-off voltage Voff is supplied to the 2ith gate line GL2i through the bypass line BPL of the switching unit 14. Simultaneously, the second switching transistor SW2 of the switching unit 14 maintains a turn-on state with the driving voltage Vdd supplied to the second node QB of the i−1st stage STi−1, and the gate-off voltage Voff is continuously supplied to the 2i−1st gate line GL2i−1.

As described above, the shift register 10 according to an embodiment of the present invention supplies the gate-on voltage pulse to at least two adjacent gate lines by using one stage, and thus, an area of each stage is reduced. That is, in the shift register 10 according to an embodiment of the present invention, one stage is provided in two stage areas of the related art, thus reducing a width and area of each stage.

Figure 5:
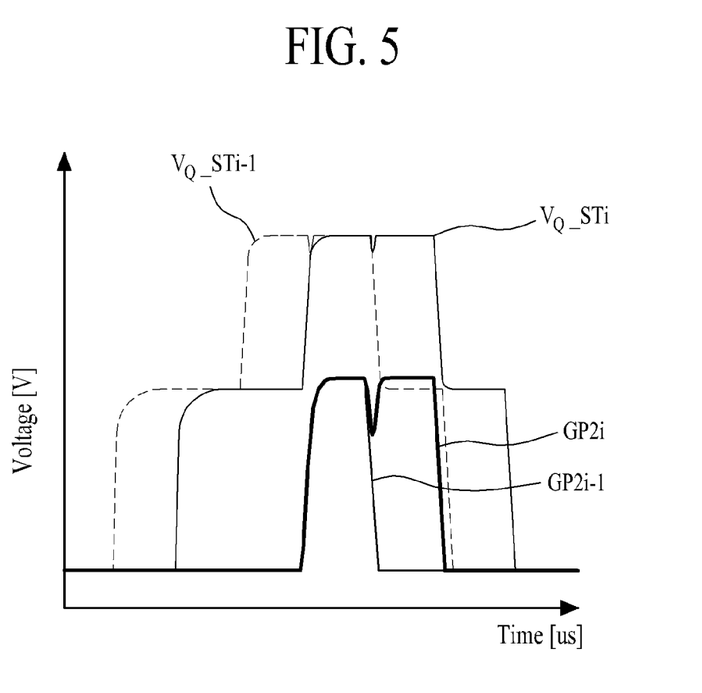
FIG. 5 is an operation simulation waveform diagram of the ith stage of FIG. 3.

FIG. 5 is an operation simulation waveform diagram of the ith stage of FIG. 3, and shows the first node voltages $V_Q\_STi-1$ and $V_Q\_STi$ of the i−1st and ith stages and the 2i−1 and 2ith gate-on voltage pulses GP2i−1 and GP2i with respect to time.

As seen in FIG. 5, it can be seen that the ith stage STi sequentially generates the 2i−1 and 2ith gate-on voltage pulses GP2i−1 and GP2i having different pulse widths in synchronization with the first node voltage $V_Q\_STi-1$ of the i−1st stage.

Figure 6:
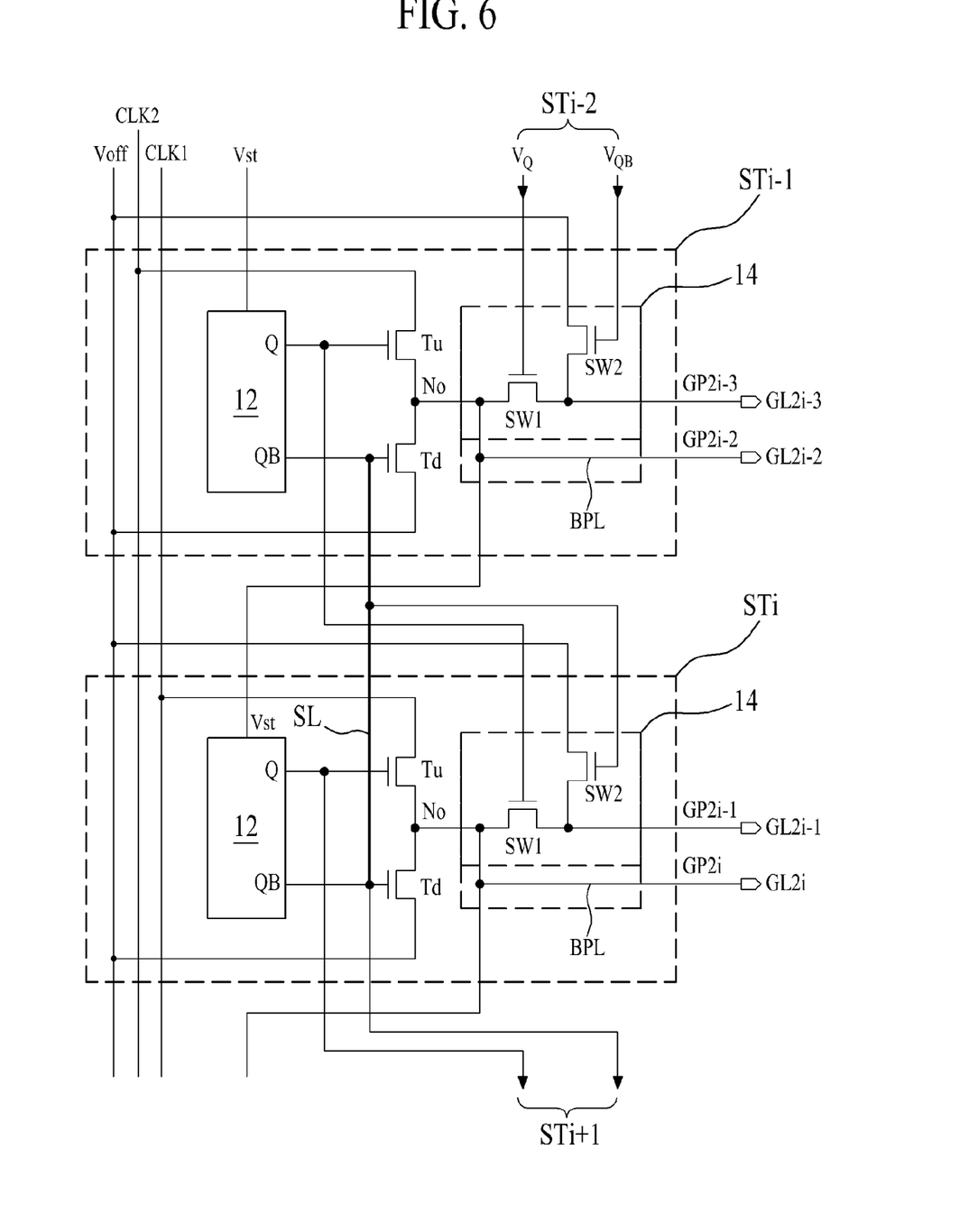
FIG. 6 is a diagram illustrating a structure of each stage describing a first modification example of the shift register according to an embodiment of the present invention.

FIG. 6 is a diagram illustrating a structure of each stage for describing a first modification example of the shift register according to an embodiment of the present invention, and illustrates that the second nodes QB of two adjacent stages are shared. Hereinafter, only a sharing structure of the second nodes QB will be described.

Two adjacent stages STi−1 and STi share the second node QB through a sharing line SL which is formed in correspondence with the two adjacent stages STi−1 and STi. Therefore, the node controller 14 of one of the two adjacent stages STi−1 and STi is configured with a plurality of node control transistors for controlling the voltage of the second node QB, but the node controller 14 of the other of the two adjacent stages STi−1 and STi does not include a plurality of node control transistors for controlling the voltage of the second node QB.

Accordingly, in the shift register according to the first modification example, the two adjacent stages STi−1 and STi share the second node QB, and therefore, one of the two adjacent stages STi−1 and STi is reduced in area, thus reducing a total area.

Figure 7:
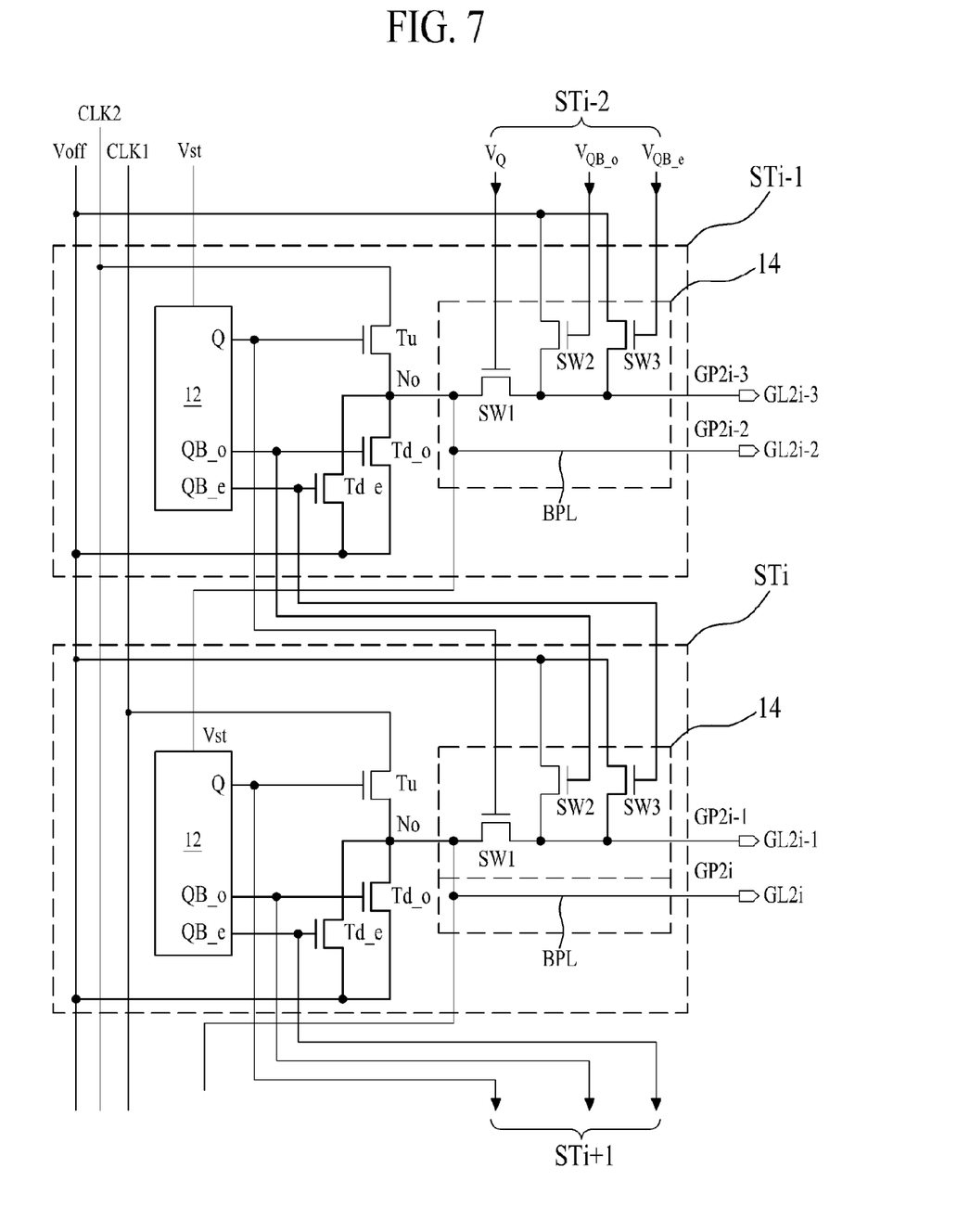
FIG. 7 is a diagram illustrating a structure of each stage describing a second modification example of the shift register according to an embodiment of the present invention.

FIG. 7 is a diagram illustrating a structure of each stage for describing a second modification example of the shift register according to an embodiment of the present invention, and illustrates that a configuration of each of the pull-down transistor and the switching unit is changed for preventing a deterioration due to a continuous turn-on of the pull-down transistor. Hereinafter, only different elements will be described.

The pull-down transistor of each of the first to mth stages ST1 to STm is configured with first and second pull-down transistors Td_o and Td_e.

The first pull-down transistor Td_o includes a gate connected to an odd-numbered second node QB_o, a first terminal connected to the output node No, and a second terminal connected to the gate-off line voltage Voff line. The first pull-down transistor Td_o is turned on during an odd-numbered frame of the display panel in which the driving voltage is supplied to the odd-numbered second node QB_o according to control by the node controller 12 to supply the gate-off voltage Voff to the output node No, and maintains a turn-on state during an even-numbered frame of the display panel in which the gate-off voltage Voff is supplied to the odd-numbered second node QB_o according to control by the node controller 12.

The second pull-down transistor Td_e includes a gate connected to an even-numbered second node QB_e, a first terminal connected to the output node No, and a second terminal connected to the gate-off line voltage Voff line. The second pull-down transistor Td_e is turned on during an odd-numbered frame of the display panel in which the driving voltage is supplied to the even-numbered second node QB_e according to control by the node controller 12 to supply the gate-off voltage Voff to the output node No, and maintains a turn-on state during an odd-numbered frame of the display panel in which the gate-off voltage Voff is supplied to the even-numbered second node QB_e according to control by the node controller 12.

The first and second pull-down transistors Td_o and Td_e are alternately turned on in units of a frame with the voltages of the odd-numbered second node QB_o and even-numbered second node QB_e controlled by the node controller 12 to supply the gate-off voltage Voff to the output node No.

The switching unit 14 includes first to third switching transistors SW1 to SW3. Except that the third switching transistor SW3 is added and a connection structure of the second switching transistor SW2 is changed, the switching unit 14 of FIG. 7 is the same as FIG. 3, and thus, its detailed description is not provided.

First, the second switching transistor SW2 is turned on with a voltage of the odd-numbered second node QB_o of a previous stage STi−1 or the present stage STi to supply the gate-off voltage Voff to the 2i−1st gate line GL2i−1.

The third switching transistor SW3 is turned on with a voltage of the even-numbered second node QB_e of the previous stage STi−1 or the present stage STi to supply the gate-off voltage Voff to the 2i−1st gate line GL2i−1.

The second and third switching transistors SW2 and SW3 are alternately turned on with the voltages of the odd-numbered second node QB_o and even-numbered second node QB_e of the previous stage STi−1 or the present stage STi, and thus, as described above in FIG. 3, the gate-on voltage pulse GP2i−1 having the second pulse width is supplied to the 2i−1st gate line GL2i−1, and then the second and third switching transistors SW2 and SW3 alternately supply the gate-off voltage Voff to the 2i−1st gate line GL2i−1.

The above-described shift register according to the second modification example provides the same effect as FIG. 3, and can minimize a deterioration of the pull-down transistors Td_o and Td_e.

Figure 8:
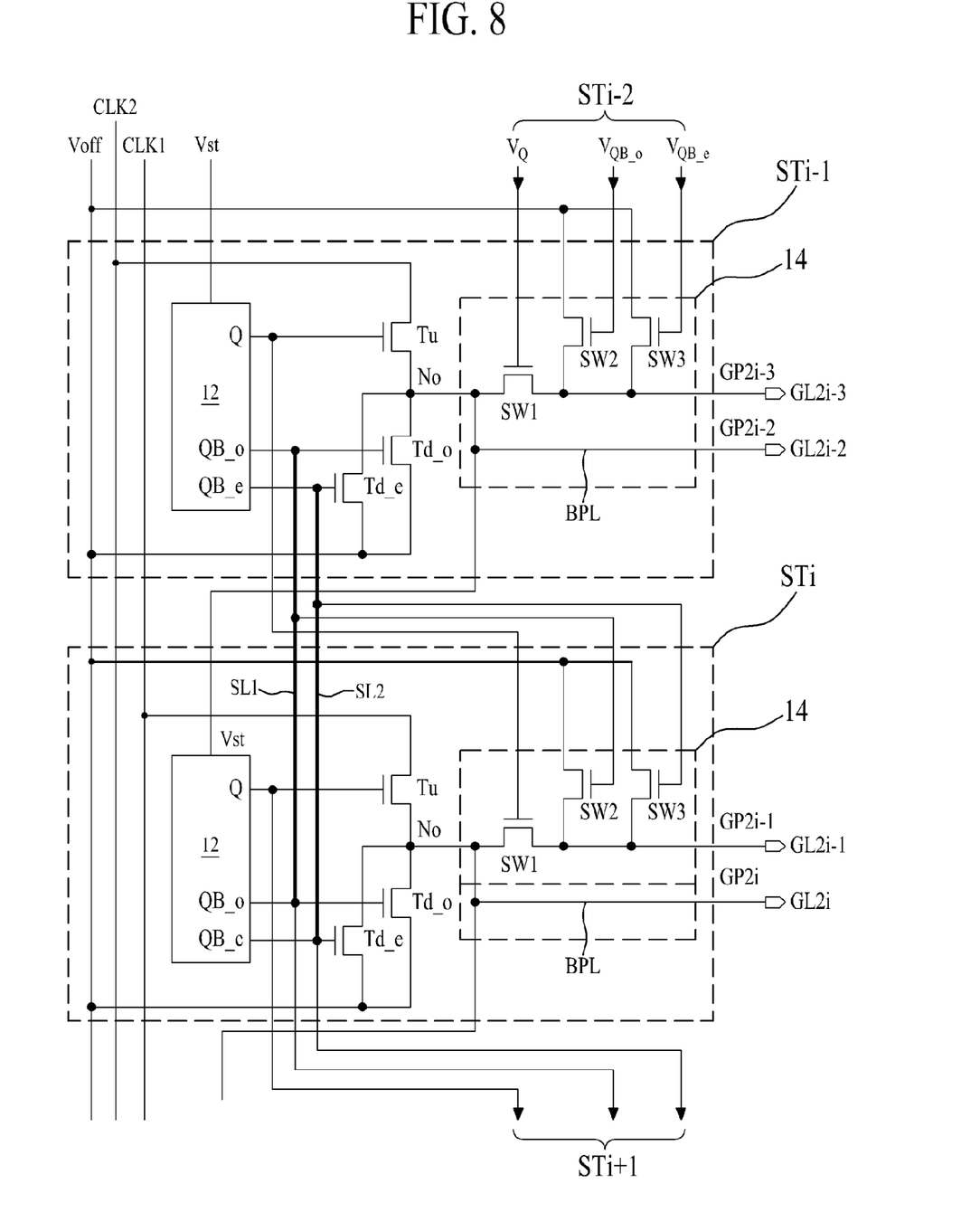
FIG. 8 is a diagram describing a sharing structure of two adjacent stages in the shift register according to the second modification example illustrated in FIG. 7.

FIG. 8 is a diagram for describing a sharing structure of two adjacent stages in the shift register according to the second modification example illustrated in FIG. 7, and illustrates that the odd-numbered second node QB_o and even-numbered second node QB_e of two adjacent stages are shared. Hereinafter, only a sharing structure of the second nodes QB will be described.

Two adjacent stages STi−1 and STi share the odd-numbered second node QB_o and the even-numbered second node QB_e through respective first and second sharing lines SL1 and SL2 which are formed in correspondence with the two adjacent stages STi−1 and STi. Therefore, the node controller 14 of one of the two adjacent stages STi−1 and STi includes a plurality of node control transistors for controlling the voltages of the odd-numbered second node QB_o and even-numbered second node QB_e, but the node controller 14 of the other of the two adjacent stages STi−1 and STi does not include a plurality of node control transistors for controlling the voltages of the odd-numbered second node QB_o and even-numbered second node QB_e.

Accordingly, in the shift register according to the second modification example, the two adjacent stages STi−1 and STi share the odd-numbered second node QB_o and the even-numbered second node QB_e, and therefore, one of the two adjacent stages STi−1 and STi is reduced in area, thus reducing a total area.

Figure 9:
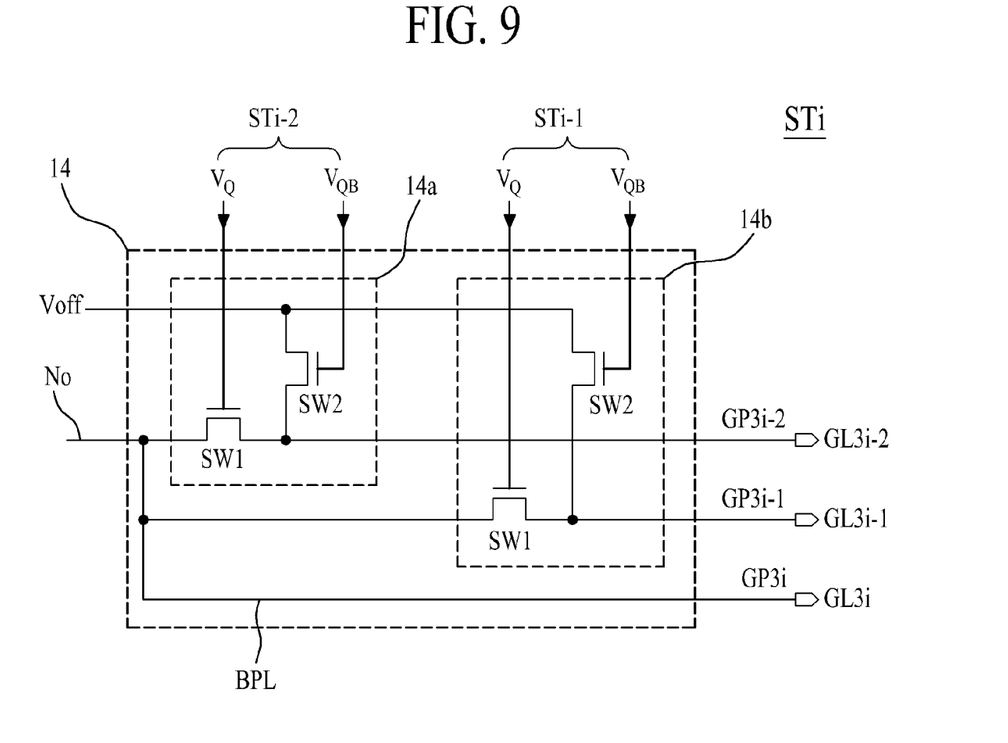
FIG. 9 is a diagram illustrating a switching unit of an ith stage in a shift register according to another embodiment of the present invention.
Figure 10:
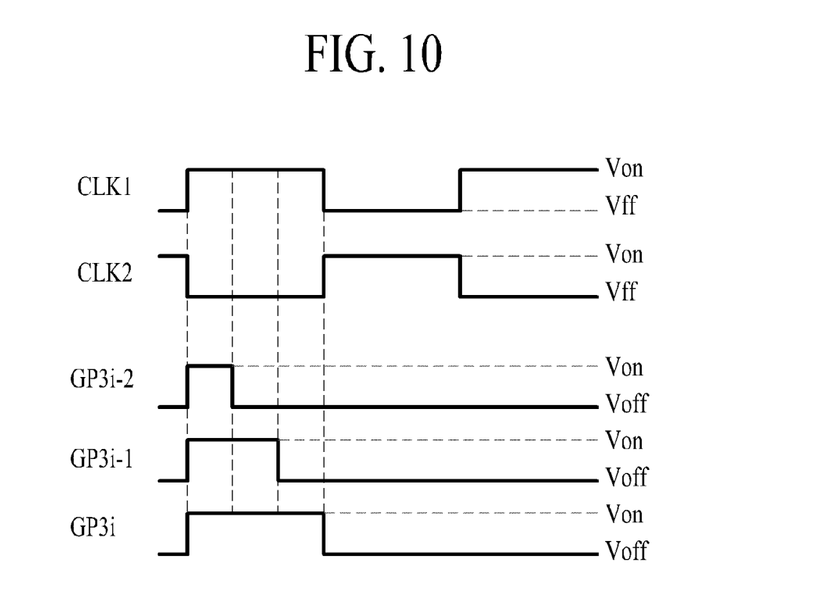
FIG. 10 is an input/output waveform diagram of the ith stage of FIG. 9.

FIG. 9 is a diagram illustrating a switching unit of an ith stage in a shift register according to another embodiment of the present invention, and FIG. 10 is an input/output waveform diagram of the ith stage of FIG. 9. In the embodiment, the gate-on voltage pulses having different pulse widths is sequentially supplied to three gate lines, respectively. Hereinafter, only different elements will be described with reference to FIGS. 9 and 10.

A switching unit 14 of the ith stage STi includes a bypass line BPL and first and second switching circuits 14a and 14b.

The bypass line BPL is connected between an output node No and a 3ith gate line GL3i, and thus, when the pull-up transistor Tu and the pull-down transistor Td (Td_o, Td_e) are turned on, the bypass line BPL bypasses a first clock signal CLK1 having a gate-on voltage level, supplied to the output node No, to the 3ith gate line GL3i as a 3ith gate-on voltage pulse GP3i. Here, the first clock signal CLK1 having the gate-on voltage level has a pulse width corresponding to three horizontal periods of the display panel.

The first switching circuit 14a, as described above, is configured with first and second switching transistors SW1 and SW2, and supplies a portion of the first clock signal CLK1 having the gate-on voltage level supplied from the output node No to a 3i−2nd gate line GL3i−2 as a 3i−2nd gate-on voltage pulse GP3i−2 according to voltages of first and second nodes Q and QB of a stage STi−2 previous to a previous stage. Here, the 3i−2nd gate-on voltage pulse GP3i−2 has a pulse width corresponding to one horizontal period.

The second switching circuit 14b, as described above, is configured with first and second switching transistors SW1 and SW2, and supplies a portion of the first clock signal CLK1 having the gate-on voltage level supplied from the output node No to a 3i−1st gate line GL3i−1 as a 3i−1st gate-on voltage pulse GP3i−1 according to voltages of first and second nodes Q and QB of a previous stage STi−1. Here, the 3i−1st gate-on voltage pulse GP3i−1 has a pulse width corresponding to two horizontal periods.

When the switching unit 14 is turned on with the voltages of the first and second nodes Q and QB of each of the previous stage STi−1 and the stage STi−2 previous thereto, the ith stage STi of the shift register according to another embodiment of the present invention adjusts a falling time of the first clock signal CLK1 supplied from the output node No to sequentially supply three gate-on voltage pulses having different pulse widths to three adjacent gate lines GL3i−2, GL3i−1 and GL3i. since the shift register according to another embodiment of the present invention sequentially supplies the gate-on voltage pulse to three adjacent gate lines by using one stage, an area occupied by each stage is reduced. That is, in the shift register according to another embodiment of the present invention, one stage is provided in three stage areas of the related art, thus more reducing a width and area of each stage.

In the description of FIGS. 2 to 10, it has been described above that the gate-on voltage pulse is sequentially supplied to two or three adjacent gate lines by using one stage, but the present invention is not limited thereto. For another example, by changing the number of switching units, the gate-on voltage pulse may be sequentially supplied to at least four adjacent gate lines by using one stage.

In addition, the above-described shift register has been described above as using the first and second clock signals CLK1 and CLK2, but may use at least four or more clock signals without being limited thereto. Here, when the above-described shift register uses four clock signals for sequentially supplying the gate-on voltage pulse to two adjacent gate lines by using one stage, two clock signal lines can be removed from the above-described shift register, thus reducing an area.

Figure 11:
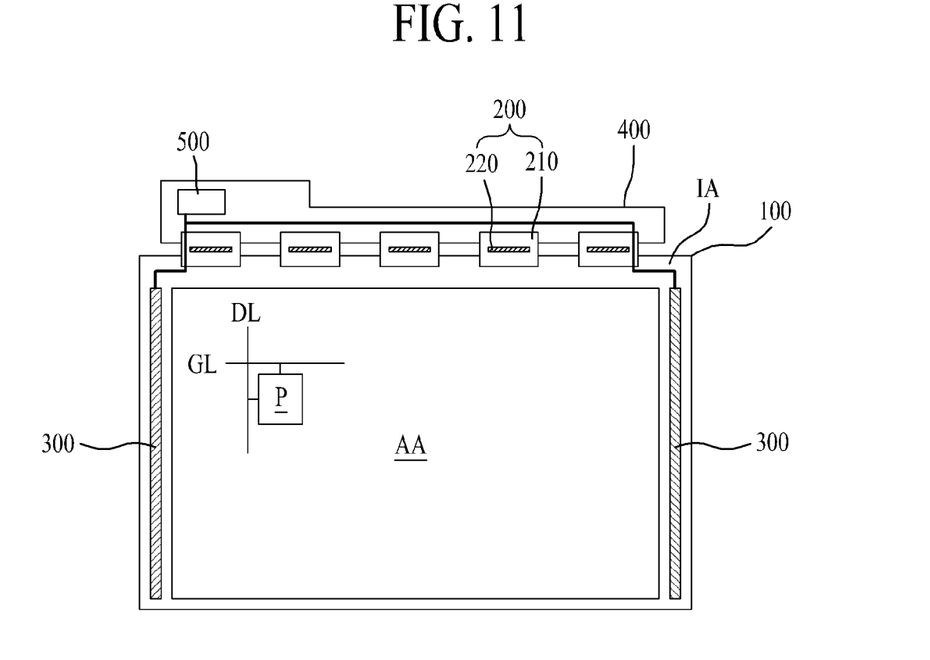
FIG. 11 is a plan view schematically illustrating a flat panel display device according to an embodiment of the present invention.

FIG. 11 is a plan view schematically illustrating a flat panel display device according to an embodiment of the present invention.

Referring to FIG. 11, the flat panel display device according to an embodiment of the present invention includes a display panel 100, a plurality of data drivers 200, a gate driver 300, a printed circuit board (PCB) 400, and a timing controller 500.

The display panel 100 includes first and second substrates facing-coupled to each other.

The first substrate includes an active area AA, including a plurality of pixels P that are respectively formed in a plurality of pixel areas defined by intersections between a plurality of gate lines GL and a plurality of data lines DL, and an inactive area IA provided near the active area AA.

Each of the plurality of pixels P includes a pixel cell for displaying an image according to the gate-on voltage pulse supplied through an adjacent gate line GL and a data voltage supplied through an adjacent data line DL. Here, the pixel cell includes at least one TFT and at least one capacitor, and may be a liquid crystal cell, which adjusts a light transmittance of liquid crystal according to the data voltage to display an image, or an emission cell that emits light in proportion to a current based on the data voltage to display an image.

The second substrate covers the first substrate other than a portion of the inactive area IA. In this case, when each pixel P is configured with the liquid crystal cell, the second substrate may include a color filter layer overlapping between the pixels P.

The plurality of data drivers 200 are adhered to the first substrate of the display panel 100, and supply data voltages to the plurality of data lines DL. To this end, each of the plurality of data drivers 200 includes a data flexible circuit film 210 and data driving IC 220.

The data flexible circuit film 210 is adhered to a data pad part which is disposed in an upper inactive area of the first substrate in connection with corresponding data lines DL. The data flexible circuit film 210 may be formed as a tape carrier package (TCP) or a chip-on flexible board (COF, a chip-on film), and adhered to the data pad part by a tape automated bonding (TAB) process.

The data driving IC 220 is mounted on the data flexible circuit film 210. The data driving IC 220 converts pixel data into analog data voltages by using pixel data, a data control signal, and a plurality of gamma voltages which are inputted from the external PCB 400 through the data flexible circuit film 210, and supplies the converted data voltages to the respective data lines DL through the data flexible circuit film 210 and the data pad part.

The gate driver 300 is provided in each of left and right inactive areas of the first substrate when a process of manufacturing the TFTs of the respective pixels is being performed, and supplies the gate-on voltage pulse to each of both sides of the plurality of gate lines. At this time, the gate-on voltage pulse may be simultaneously supplied to both sides of each gate line GL. The gate driver 300 may be configured with the shift register 100 including the plurality of stages ST1 to STm illustrated in one of FIGS. 2 and 6 to 9. Thus, a description on the gate driver 300 is not provided.

The PCB 400 is adhered to the data flexible circuit films 210 of the respective data drivers 200 in common. The timing controller 500, a user connector (not shown), and a power generator (not shown), which generates a reference gamma voltage, a common voltage, and various source voltages, are mounted on the PCB 400.

The timing controller 500 aligns video data inputted through the user connector in correspondence with driving of the display panel 100 to generate pixel data, and generates a data control signal based on a timing sync signal inputted through the user connector (not shown). The pixel data and the data control signal are supplied to the data driving ICs 220 through the PCB 400 and the data flexible circuit film 210.

Moreover, as shown in FIG. 4, the timing controller 500 generates a gate control signal including the gate start signal Vst and at least two clock signals on the basis of the timing sync signal. The gate control signal is supplied to the gate driver 300 through the PCB 400, the first and last data flexible circuit films 220, and both upper corners of the first substrate.

The timing controller 500 may not be mounted on the PCB 400, and may be mounted on a separate control board (not shown) connected to the PCB 400. In addition, the gate driver 300 may be provided in only one of the left and right inactive areas.

The above-described flat panel display device according to an embodiment of the present invention includes the shift register built into the inactive area of the display panel 100, and thus, as described above, the gate-on voltage pulse is sequentially supplied to two or three adjacent gate lines through each stage of the shift register. Accordingly, the flat panel display device according to an embodiment of the present invention can have a reduced bezel width because the shift register is reduced in area.

As described above, the shift register according to the present invention supplies the gate-on voltage pulse to at least two adjacent gate lines by using one stage, and therefore, an area of each stage is reduced, thus decreasing a total area.

Moreover, the flat panel display device including the shift register according to the present invention can have a reduced bezel width because an area of the shift register built into the inactive area of the display panel is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages configured to supply a gate-on voltage pulse to a plurality of gate lines which are formed in a display panel, each of the plurality of stages comprising:
    a pull-up transistor configured to supply one of a plurality of clock signals to an output node according to a voltage of a first node;
    at least one pull-down transistor configured to supply a gate-off voltage to the output node according to a voltage of at least one second node;
    a node controller configured to control the voltages of the first and at least one second nodes on the basis of a gate start signal; and
    a switching unit connected to at least two gate lines adjacent to the output node, and configured to sequentially supply gate-on voltage pulses having different pulse widths to the at least two adjacent gate lines by using the clock signal supplied to the output node, respectively.

2. The shift register of claim 1, wherein the switching unit is turned on according to voltages of the first and at least one second nodes of a previous stage, and adjusts a falling time of the clock signal to supply a first gate-on voltage pulse to a first gate line of the two adjacent gate lines and to simultaneously bypass the clock signal to a second gate line of the two adjacent gate lines.

3. The shift register of claim 2,
    wherein the first gate-on voltage pulse has a pulse width narrower than the clock signal, and
    wherein the second gate-on voltage pulse has the same pulse width as the clock signal to overlap the first gate-on voltage pulse.

4. The shift register of claim 2, wherein the switching unit comprises:
    a first switching transistor configured to turn on according to the voltage of the first node of the previous stage to supply the clock signal, supplied from the output node, to the first gate line;
    a second switching transistor configured to turn on according to the voltage of the at least one second node of the previous stage to supply the gate-off voltage to the first gate line; and
    a bypass line connected to the output node and the second gate line, and configured to bypass the clock signal, supplied from the output node, to the second gate line.

5. The shift register of claim 4, wherein the first gate-on voltage pulse has a pulse width narrower than the clock signal according to the first and second switching transistors being turned on.

6. The shift register of claim 2, further comprising a sharing line formed in correspondence with two adjacent stages, and configured to enable the at least one second node of each of the two adjacent stages to be shared.

7. The shift register of claim 2, wherein,
    the at least one second node comprises an odd-numbered second node and an even-numbered second node,
    the at least one pull-down transistor comprises: a first pull-down transistor configured to supply the gate-off voltage to the output node according to a voltage of the odd-numbered second node; and a second pull-down transistor configured to supply the gate-off voltage to the output node according to a voltage of the even-numbered second node, and
    the node controller alternately controls the voltage of the odd-numbered second node and the voltage of the even-numbered second node such that the first and second pull-down transistors are alternately turned on.

8. The shift register of claim 7, wherein the switching unit comprises:
    a first switching transistor configured to turn on according to the voltage of the first node of the previous stage to supply the clock signal, supplied from the output node, to the first gate line;
    a second switching transistor configured to turn on according to the voltage of the odd-numbered second node of the previous stage to supply the gate-off voltage to the first gate line;
    a third switching transistor configured to turn on according to the voltage of the even-numbered second node of the previous stage to supply the gate-off voltage to the first gate line; and a bypass line connected to the output node and the second gate line, and configured to bypass the clock signal, supplied from the output node, to the second gate line.

9. The shift register of claim 7, further comprising first and second sharing lines formed in correspondence with two adjacent stages, and configured to enable the odd-numbered second node and even-numbered second node of each of the two adjacent stages to be shared.

10. A flat panel display device comprising:
a display panel configured to comprise an active area, comprising a plurality of pixels that are respectively formed in a plurality of pixel areas defined by intersections between a plurality of gate lines and a plurality of data lines, and an inactive area defined near the active area;
a plurality of data drivers configured to convert input pixel data into data signals, and respectively supply the data signals to the plurality of data lines;
a gate driver provided in the inactive area of the display panel in connection with the plurality of gate lines, and configured to generate a gate-on voltage pulse on the basis of a gate start signal and a plurality of clock signals to supply the gate-on voltage pulse to the plurality of gate lines; and
a timing controller configured to convert input video data into the pixel data, supply the pixel data to the plurality of data drivers, and supply a gate control signal, comprising the gate start signal and the plurality of clock signals, to the gate driver,
wherein the gate driver includes a shift register comprising a plurality of stages, wherein each of the plurality of stages comprising:
a pull-up transistor configured to supply one of the plurality of clock signals to an output node according to a voltage of a first node;
at least one pull-down transistor configured to supply a gate-off voltage to the output node according to a voltage of at least one second node;
a node controller configured to control the voltages of the first and at least one second nodes on the basis of a gate start signal; and
a switching unit connected to at least two gate lines adjacent to the output node, and configured to sequentially supply gate-on voltage pulses having different pulse widths to the at least two adjacent gate lines by using the clock signal supplied to the output node, respectively.

11. The flat panel display device of claim 10, wherein the switching unit is turned on according to voltages of the first and at least one second nodes of a previous stage, and adjusts a falling time of the clock signal to supply a first gate-on voltage pulse to a first gate line of the two adjacent gate lines and to simultaneously bypass the clock signal to a second gate line of the two adjacent gate lines.

12. The flat panel display device of claim 11, wherein,
the first gate-on voltage pulse has a pulse width narrower than the clock signal, and
the second gate-on voltage pulse has the same pulse width as the clock signal to overlap the first gate-on voltage pulse.

13. The flat panel display device of claim 11, wherein the switching unit comprises:
a first switching transistor configured to turn on according to the voltage of the first node of the previous stage to supply the clock signal, supplied from the output node, to the first gate line;
a second switching transistor configured to turn on according to the voltage of the at least one second node of the previous stage to supply the gate-off voltage to the first gate line; and
a bypass line connected to the output node and the second gate line, and configured to bypass the clock signal, supplied from the output node, to the second gate line.

14. The flat panel display device of claim 13, wherein the first gate-on voltage pulse has a pulse width narrower than the clock signal according to the first and second switching transistors being turned on.

15. The flat panel display device of claim 11, wherein the shift register further comprises a sharing line formed in correspondence with two adjacent stages, and configured to enable the at least one second node of each of the two adjacent stages to be shared.

16. The flat panel display device of claim 11, wherein,
the at least one second node comprises an odd-numbered second node and an even-numbered second node,
the at least one pull-down transistor comprises: a first pull-down transistor configured to supply the gate-off voltage to the output node according to a voltage of the odd-numbered second node; and a second pull-down transistor configured to supply the gate-off voltage to the output node according to a voltage of the even-numbered second node, and
the node controller alternately controls the voltage of the odd-numbered second node and the voltage of the even-numbered second node such that the first and second pull-down transistors are alternately turned on.

17. The flat panel display device of claim 16, wherein the switching unit comprises:
a first switching transistor configured to turn on according to the voltage of the first node of the previous stage to supply the clock signal, supplied from the output node, to the first gate line;
a second switching transistor configured to turn on according to the voltage of the odd-numbered second node of the previous stage to supply the gate-off voltage to the first gate line;
a third switching transistor configured to turn on according to the voltage of the even-numbered second node of the previous stage to supply the gate-off voltage to the first gate line; and
a bypass line connected to the output node and the second gate line, and configured to bypass the clock signal, supplied from the output node, to the second gate line.

18. The flat panel display device of claim 16, wherein the shift register further comprises first and second sharing lines formed in correspondence with two adjacent stages, and configured to enable the odd-numbered second node and even-numbered second node of each of the two adjacent stages to be shared.

* * * * *